United States Patent [19]

Ohta et al.

[11] Patent Number: 5,066,381

[45] Date of Patent: Nov. 19, 1991

[54] TARGET UNIT

[75] Inventors: Kenji Ohta, Kitakatsuragi; Yoshiteru Murakami, Nishinomiya; Nobuyuki Takamori, Nara; Kenichi Hijikata; Takyuki Shingyoji, both of Urawa; Kazushige Takaishi, Omiya, all of Japan

[73] Assignees: Sharp Kabushiki Kaisha, Osaka; Mitsubishi Metal Corporation, Tokyo, both of Japan

[21] Appl. No.: 602,382

[22] Filed: Oct. 24, 1990

Related U.S. Application Data

[63] Continuation of Ser. No. 338,315, Apr. 14, 1989, abandoned.

[30] Foreign Application Priority Data

Apr. 15, 1988 [JP] Japan ................................. 63-93053
Apr. 15, 1988 [JP] Japan ................................. 63-93054

[51] Int. Cl.⁵ .............................................. C23C 14/34
[52] U.S. Cl. ........................... 204/298.12; 204/298.13; 204/298.19
[58] Field of Search ....................... 204/298.12, 298.13, 204/298.19

[56] References Cited

U.S. PATENT DOCUMENTS

| 4,200,510 | 4/1980 | O'Connell et al. | 204/192.12 |
| 4,421,628 | 12/1983 | Quaderer | 204/298 |
| 4,468,313 | 8/1984 | Okumura et al. | 204/298 |
| 4,485,000 | 11/1984 | Kawaguchi et al. | 204/298 |

FOREIGN PATENT DOCUMENTS

| 3030329 | 2/1982 | Fed. Rep. of Germany | 204/298 TS |
| 55-97472 | 7/1980 | Japan | 204/298 TS |
| 58-130276 | 8/1983 | Japan | 204/298 |
| 60-39158 | 2/1985 | Japan | 204/298 |
| 60-65529 | 4/1985 | Japan | 204/298 TS |
| 61-231168 | 10/1986 | Japan | 204/298 |
| 63-37369 | 2/1987 | Japan | 204/298.12 |
| 62-211373 | 9/1987 | Japan | 204/298 TS |
| 62-243762 | 10/1987 | Japan | 204/298.12 |

Primary Examiner—Aaron Weisstuch
Attorney, Agent, or Firm—Cushman, Darby & Cushman

[57] ABSTRACT

A target unit includes a backing plate and a target member disposed on the backing plate. The target member includes at least one erosion member of a sputtering material and at least one holding member for releasably holding the erosion member on the backing plate.

26 Claims, 11 Drawing Sheets

FIG.1 (PRIOR ART)
FIG.2 (PRIOR ART)
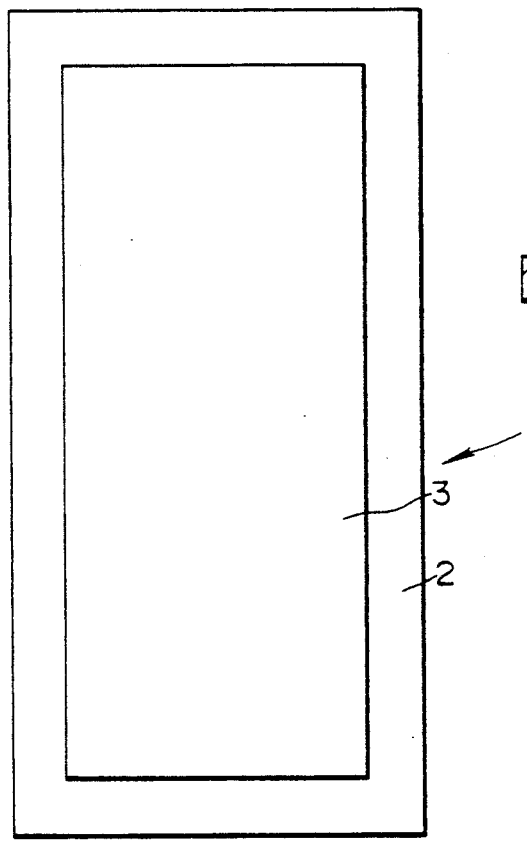
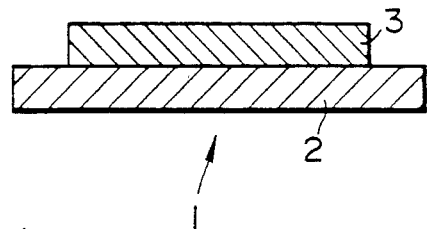
FIG.3 (PRIOR ART)
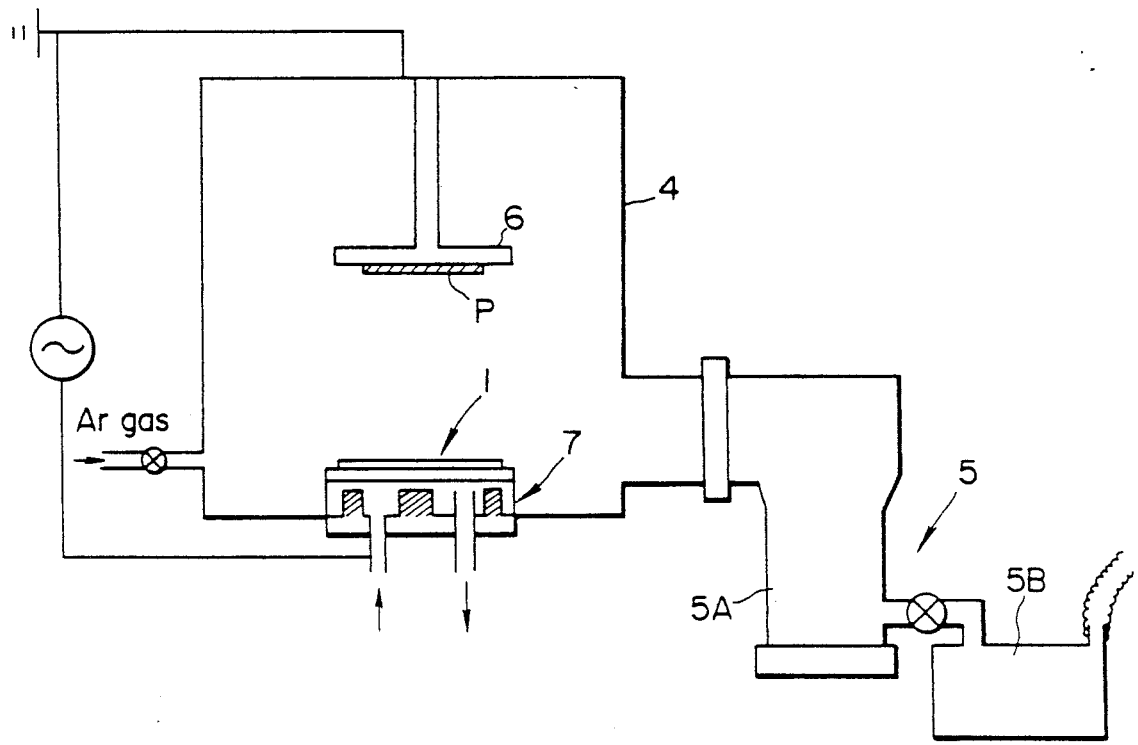

FIG. 4 *(PRIOR ART)*
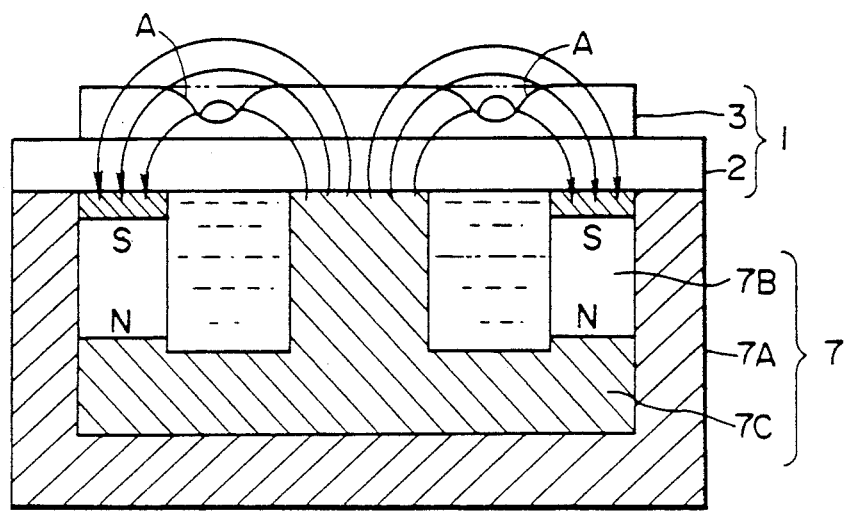
FIG. 5
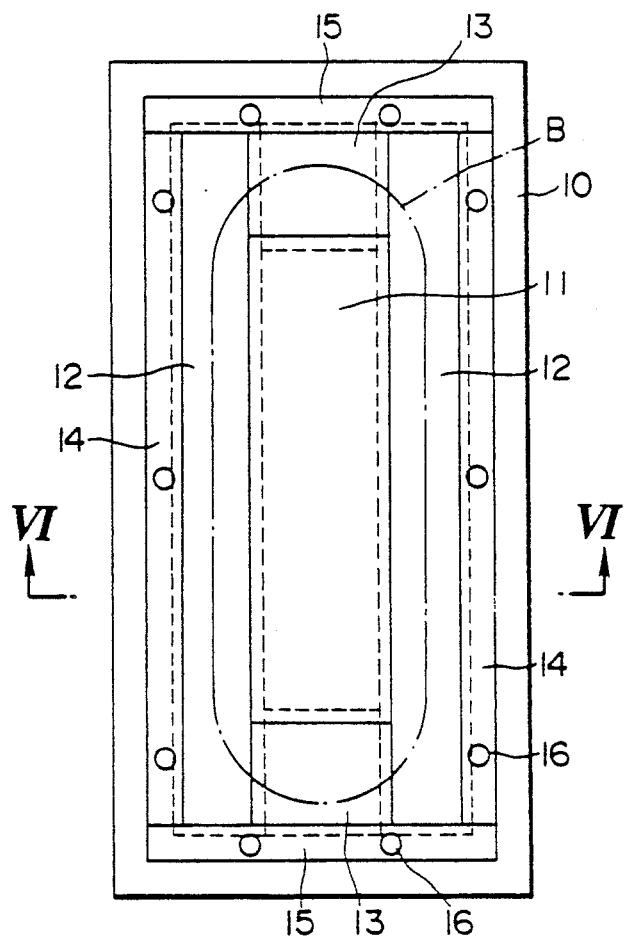
FIG. 6
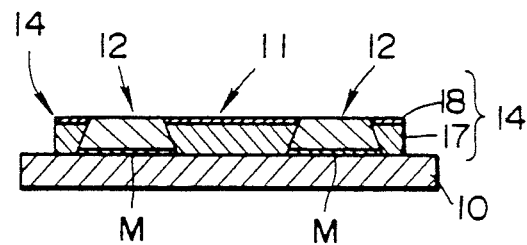

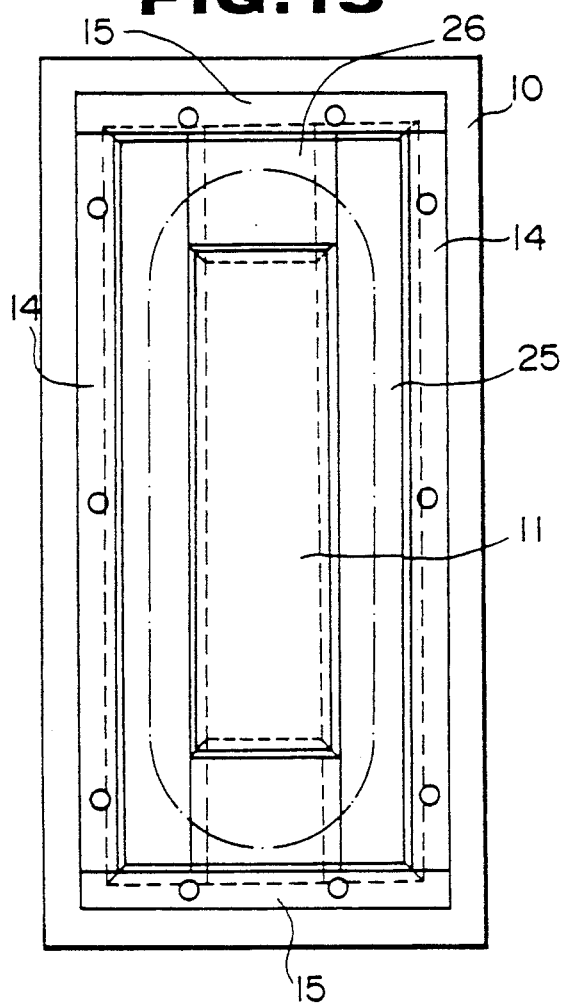
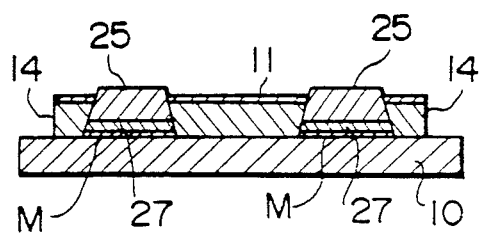
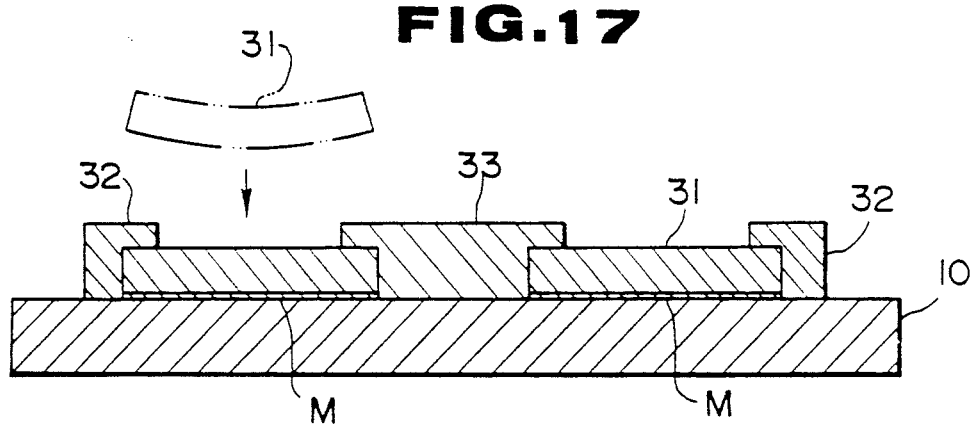

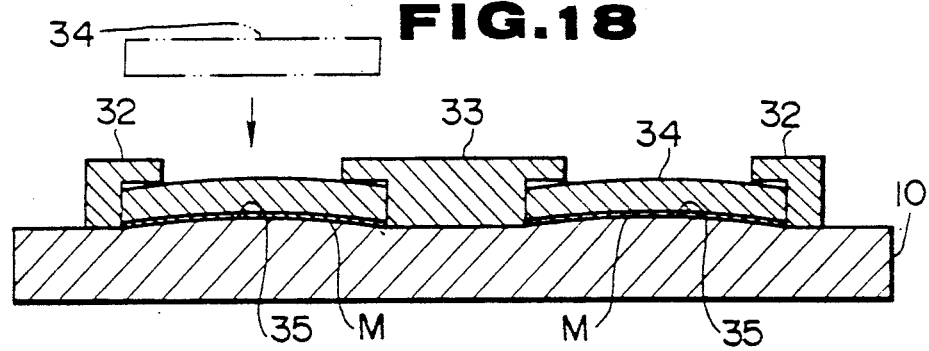
FIG.18
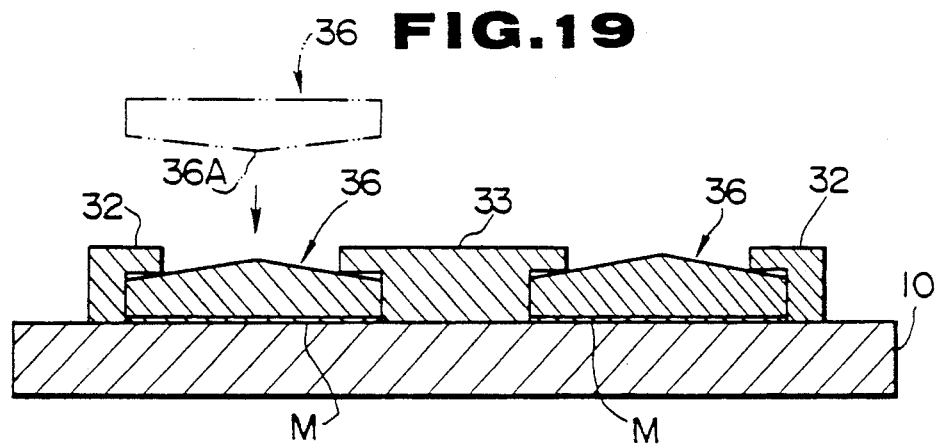
FIG.19
FIG.20
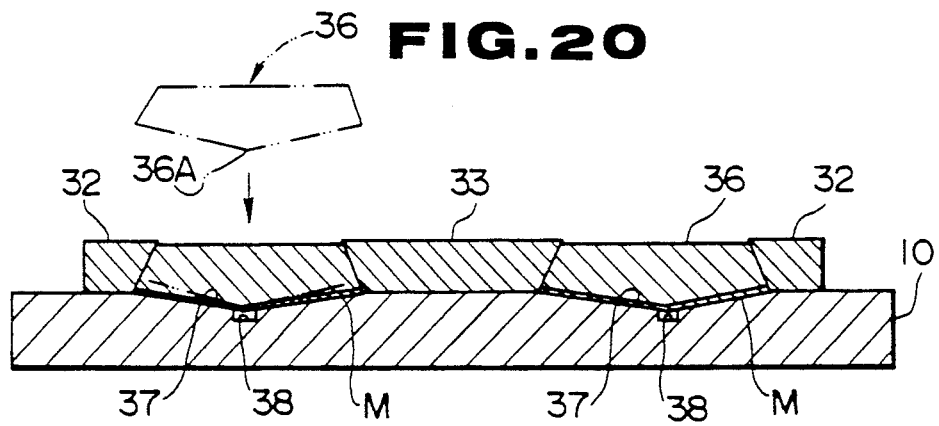
FIG.21
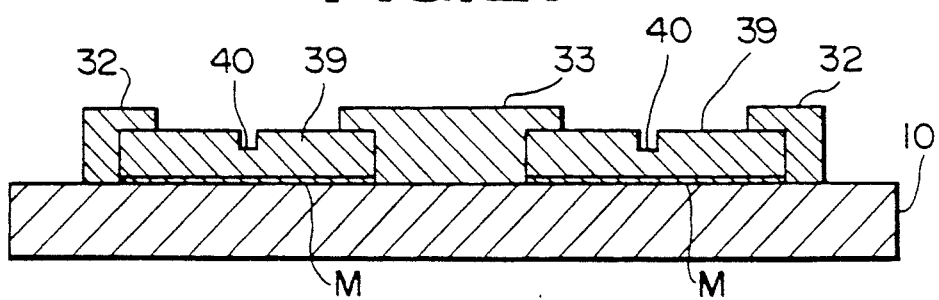

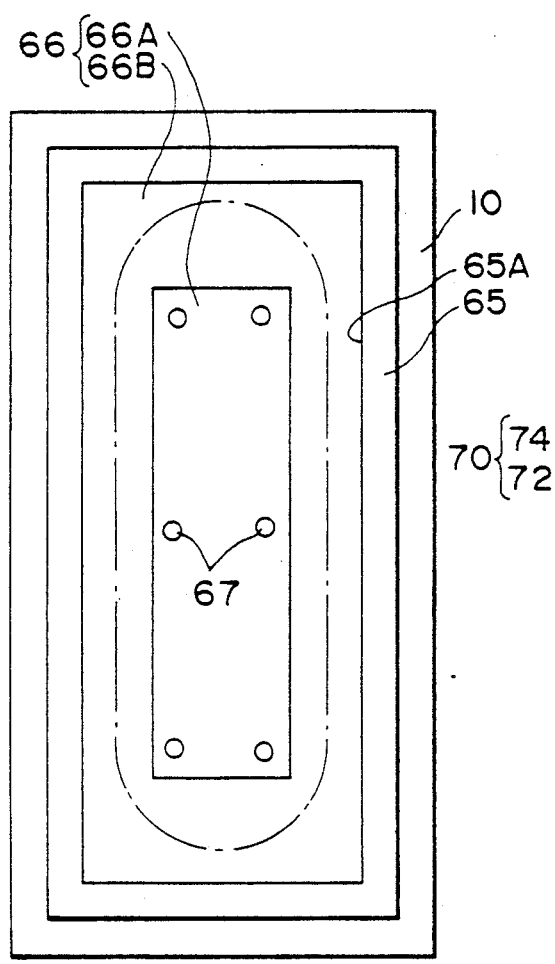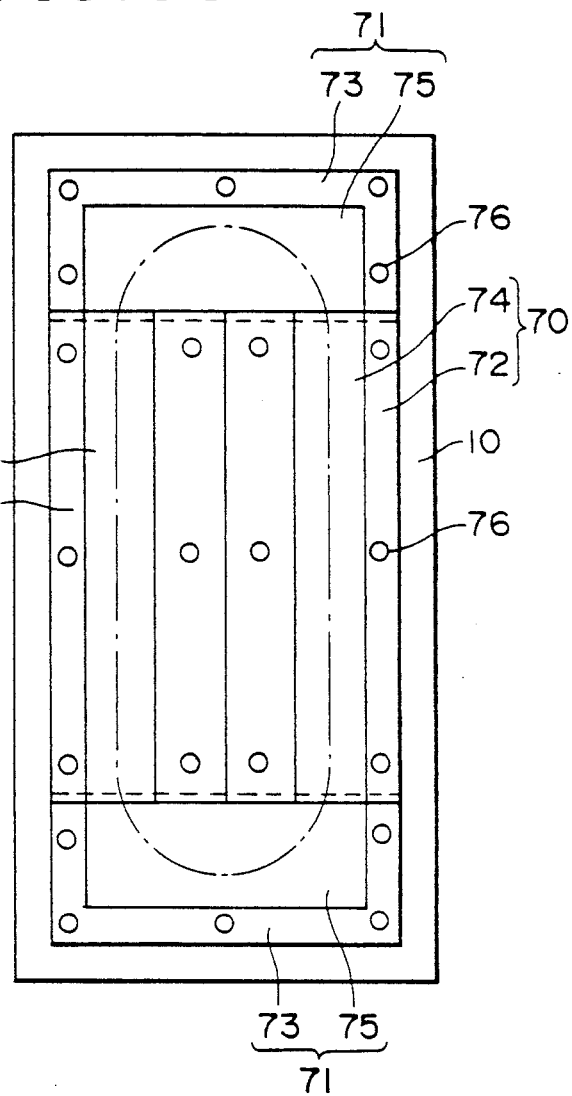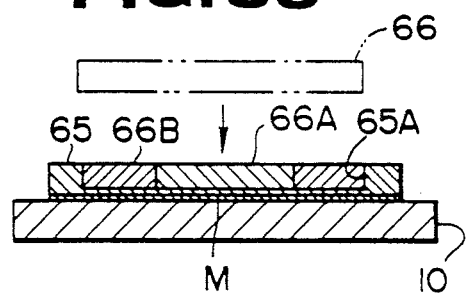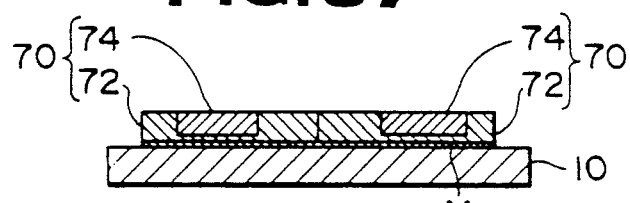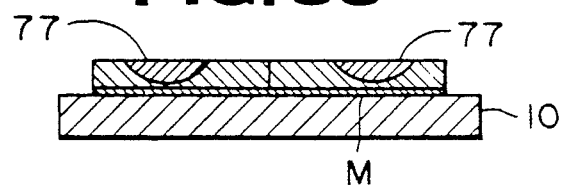

TARGET UNIT

This is a continuation of application Ser. No. 07/338,315, filed Apr. 14, 1989, which was abandoned upon the filing thereof.

BACKGROUND OF THE INVENTION

1. Field of the Invention

The present invention relates to target units for use, for example, in a magnetron sputtering process.

2. Prior Art

FIGS. 1 and 2 depict a conventional target unit 1 of a rectangular shape which comprises a backing plate 2 of copper or stainless steel and a target 3 of a sputtering material securely fixed to the backing plate 2. The target 3 and the backing plate 2 are usually joined together by means of soldering with tin-lead alloy, indium, or the like.

The target unit 1 of the above construction is used in a magnetron sputtering apparatus as schematically illustrated in FIG. 3. The sputtering apparatus includes a vacuum chamber 4, a vacuum pump assembly 5 comprised of a diffusion pump 5A and a rotary pump 5B, a holder 6 for holding a substrate P, and a magnet assembly 7. As shown in FIG. 4, the magnet assembly 7 comprises a casing 7A and magnets 7B with a yoke 7C housed in the casing 7A, and the backing plate 2 of the target unit 1 is so fixed to the upper peripheral end of the casing 7A through bolts or the like as to hermetically seal the casing 7A. The casing 7A is supplied with cooling water which cools the target unit 1 from its back side. Thus, a magnetic field of an oblong shape is produced above the surface of the target 3 upon sputtering and causes plasma to concentrate on the surface of the target 3, thereby enhancing an efficiency of sputtering.

In the aforementioned target unit 1, however, only that portion A of the target 3 on which the magnetic field concentrates is mainly consumed, as shown in FIG. 4, and hence, the service life of the target 3 comes to an end with the sputtering material of the other portion unused.

The problem of this kind is often posed in target units for use in photomagnetic recording media, and in relation to this research has been actively carried out in recent years. More specifically, the target 3 of the target unit 1 for such an application is made of an alloy including a rare earth metal such as terbium (Tb), gadolinium (Gd) and dysprosium (Dy), and a transition metal such as iron (Fe) and cobalt (Co), and hence exhibits ferromagnetism. Therefore, when a recess as at A is formed in the target 3, a magnetic field such as to cause plasma to concentrate in the recess A is produced, so that the consumption of the bottom of the recess A is further promoted.

The target 3 which has ended its service life can be scrapped if the material is inexpensive, but since the rare earth metal used in making targets for photomagnetic recording media is expensive, the consumed target 3 must be removed from the target unit 1 and reclaimed into a new target.

In the conventional target unit 1, however, the target unit 1 must be entirely removed from the magnet assembly and heated to melt the solder, so that the reclamation of the target 3 is laborious and time-consuming, resulting in an increase in costs.

SUMMARY OF THE INVENTION

It is therefore the object of the present invention to provide a target unit in which the target consumed by the sputtering can be easily removed therefrom and reclaimed into a new target.

According to the invention, there is provided a target unit comprising a backing plate and a target member disposed on the backing plate, the target member including at least one erosion member of a sputtering material and at least one holding member for releasably holding the erosion member on the backing plate.

BRIEF DESCRIPTION OF THE DRAWINGS

FIG. 1 is a plan view of a conventional target unit;

FIG. 2 is a cross-sectional view of the target unit of FIG. 1;

FIG. 3 is a schematic view of an ordinary magnetron sputtering apparatus;

FIG. 4 is a cross-sectional view of the target unit fixed to a magnet assembly;

FIG. 5 is a plan view showing a target unit in accordance with a first embodiment of the invention;

FIG. 6 is a cross-sectional view of the target unit of FIG. 5, taken along the line VI—VI in FIG. 5;

FIGS. 15 and 16 are views showing a target unit in accordance with a sixth embodiment of the invention;

FIGS. 17 to 23 are views similar to FIG. 6, but showing target units in accordance with seventh to thirteenth embodiments of the invention, respectively;

FIGS. 34 and 35 are views showing a target unit in accordance with a nineteenth embodiment of the invention;

FIGS. 36 and 37 are views showing a target unit in accordance with a twentieth embodiment of the invention;

FIG. 38 is a cross-sectional view showing a target unit in accordance with a twenty-first embodiment of the invention;

DESCRIPTION OF THE PREFERRED EMBODIMENTS OF THE INVENTION

Figure 7:
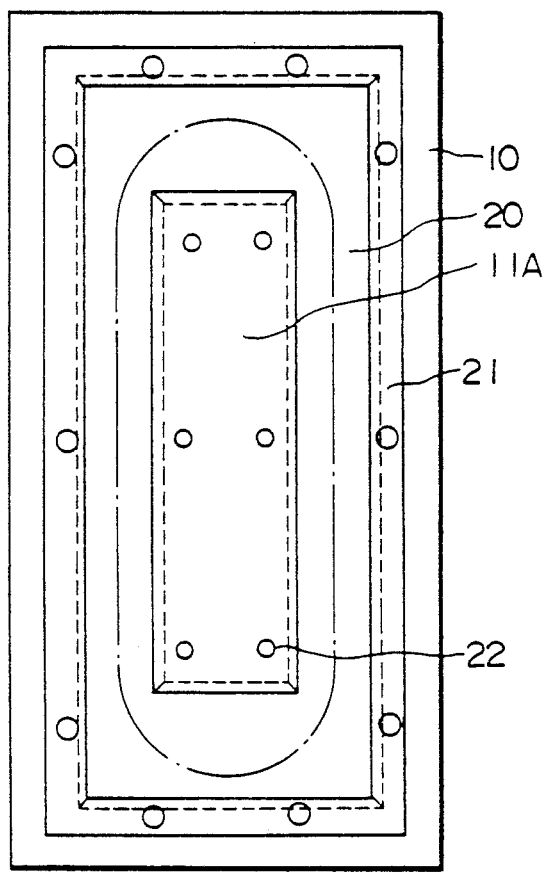
FIGS. 7 and 8 are views similar to FIGS. 5 and 6, but showing a target unit in accordance with a second embodiment of the invention.

Various embodiments of the present invention will now be described with reference to the accompanying drawings in which the same reference numerals are used to designate like parts or elements in several different views.

FIGS. 5 and 6 depict a target unit in accordance with a first embodiment of the present invention, which comprises a rectangular backing plate 10 of copper, stainless steel or the like, and a rectangular mounting member 11 or plate and a target member both disposed on the upper face of the backing plate 10. The target member is further comprised of a plurality of erosion members or plates of a sputtering material disposed on the upper face of the backing plate 10 so as to surround the mounting member 11, and a plurality of holding members or frames disposed on the upper face of the backing plate 10 so as to surround the erosion members for releasably holding the erosion members on the backing plate 10. The mounting member 11 is positioned at the central portion of the upper face of the backing plate 10 and is securely fixed thereto through brazing or other fastening means. The erosion members are comprised of a pair of opposing short erosion members 13 held in contact with the shorter side faces of the mounting member 11 and a pair of opposing long erosion members 12 held in contact with the longer side faces of the mounting member 11 and also in contact with the opposite side faces of the short erosion members 13. The sputtering material is an alloy including a rare earth metal such as terbium, gadolinium, and dysprosium, and a transition metal such as iron and cobalt. The holding members are comprised of a pair of opposing long holding frames 14 held in contact with the outer side faces of the long erosion members 12 and a pair of opposing short holding frames 15 held in contact with the outer side faces of the short erosion members 13 and with the short side faces of the long erosion members 12, and are removably secured to the backing plate 10 through a plurality of fastening means such as stud bolts 16. In the above arrangement, each erosion member 12, 13 is positioned along the area on which plasma concentrates, as designated by the chain line B in FIG. 5.

The peripheral side faces of the mounting member 11 are formed to be inclined inwardly toward the backing plate 10 at a prescribed angle, as best shown in FIG. 6, and those side faces of the erosion members 12 and 13 held in contact with the inclined peripheral side faces are so inclined as to be complementary to the peripheral side faces. Similarly, the inner side faces of the holding members 14 and 15 are so formed as to be inclined inwardly toward the backing plate 10 at a prescribed angle, and those outer side faces of the erosion members 12 and 13 held in contact with the inclined inner side faces of the holding members 14 and 15 are complementarily inclined so as to be held in close engagement therewith. The inclination angles of the above inclined faces are designed so that the erosion members 12 and 13 are prevented from coming off from the backing plate 10. Furthermore, when heated and subjected to the thermal expansion due to sputtering, the erosion members 12 and 13 are pressed against the backing plate 10 and the mounting and holding members 11, 14 and 15 with an appropriate pressure, so that a sufficient cooling effect can be achieved.

A thin sheet M of about 0.1 mm in thickness and made of a relatively soft metal such as indium (In), tin (Sn), and aluminum (Al) is interposed between the lower face of each of the erosion members 12 and 13 and the backing plate 10. With this construction, the erosion members can be brought into close contact with the backing plate 10, and hence the heat conduction therebetween is improved.

The mounting member 11 and the holding members 14 and 15 are comprised of a metal plate 17 of copper, stainless steel or the like, and a thin iron plate 18 joined to an upper face thereof. They could, however, be entirely formed of iron. The reason for having iron at least on the upper face of the members is so that even if the surfaces of the members are sputtered, the sputtered iron does not adversely affect the composition of the photomagnetic recording film. Similarly, in the case where erosion members of another composition are employed, at least the upper surfaces of the holding and mounting members should preferably be made of the main constituent in the composition of the erosion members.

In the target unit as described above, when the service life of the erosion members 12 and 13 has ended due to their consumption, the holding members 14 and 15 are first removed from the backing plate 10 by detaching the bolts 16. Then, the erosion members 12 and 13 can be easily removed from the backing plate 10. Therefore, the time required for replacing the erosion members 12 and 13 with new ones can be markedly reduced as compared with the prior art target unit. In addition, the backing plate 10 need not be removed from the magnet assembly during the replacement of the erosion members 12 and 13, so that there is no need to drain the coolant in the electrode, thereby reducing the time and cost substantially. Furthermore, inasmuch as the erosion members 12 and 13 are located only at the area on which plasma concentrates, the sputtering material can be efficiently consumed as compared with the prior art target. Furthermore, when the erosion members 12 and 13 are subjected to thermal expansion, they are strongly pressed against the mounting and holding members 11, 14 and 15, so that the heat conduction from the erosion members 12 and 13 through the holding and mounting members to the backing plate 10 is substantially improved. In addition, that component of force perpendicular to the contact surfaces of the mounting and holding members 11, 14 and 15 and the erosion members 12 and 13 presses the erosion members 12 and 13 against the backing plate 10. Accordingly, the cooling of the erosion members 12 and 13 can be effected efficiently as the temperature increases, thereby preventing the erosion members 12 and 13 from being overheated.

Figure 8:
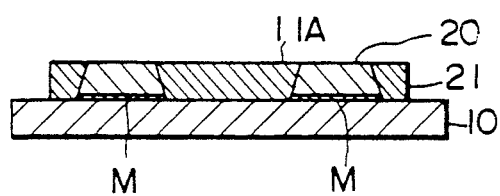

Although in the foregoing, a plurality of erosion members 12 and 13 as well as a plurality of holding members 14 and 15 are employed, they may be of a unitary construction. FIGS. 7 and 8 depict such a second embodiment wherein a single erosion member 20 as well as a single outer holding member 21 are provided. In this embodiment, the mounting member is replaced by an inner mounting member 11A which is removably secured to the backing plate 10 through known fastening means such as bolts 22, since it must be removed when replacing the erosion member 20 with a new one.

Figure 9:
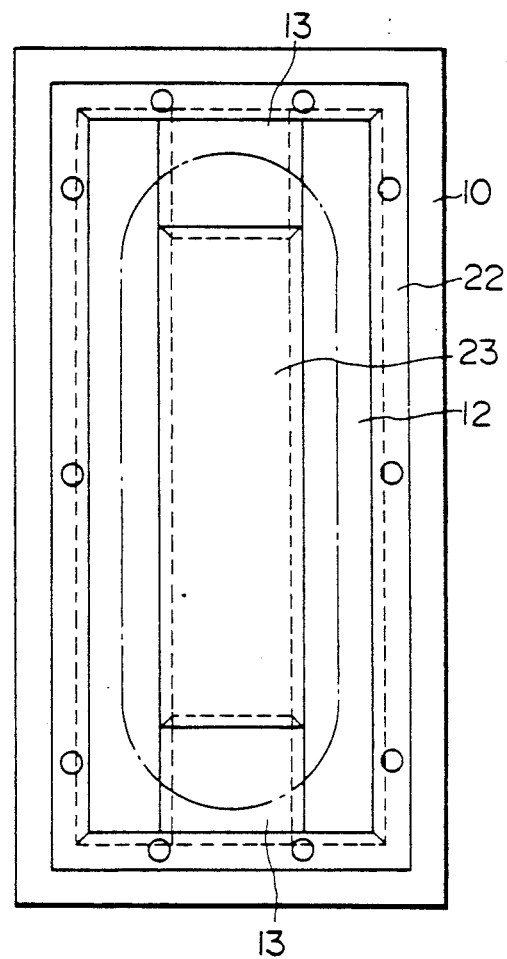
FIGS. 9 and 10 are also views similar to FIGS. 5 and 6, showing a target unit in accordance with a third embodiment of the invention.
Figure 10:
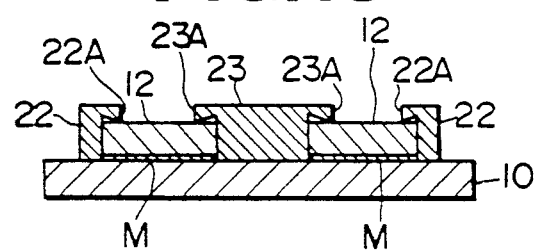

FIGS. 9 and 10 depict a target unit in accordance with a third embodiment of the present invention which includes a single mounting member 23, a plurality of erosion members 12 and 13, and a single holding member 22. Engagement lips or protrusions 23A and 22A are integrally formed on the upper portions of the peripheral side faces of the mounting member 23 and on the upper portions of the inner side faces of the holding members 22, and the erosion members 12 and 13, which have a lower height than the mounting and holding members 23 and 22, are held on the backing plate 10 by the engagement lips 23A and 22A. The engagement lips 23A and 22A are designed to reduce their susceptibility to metal fatigue when subjected to resilient stress due to the thermal expansion of the erosion members 12 and 13.

In the first embodiment, it is important to maintain an optimal contacting force between each erosion member 12, 13 and each of the mounting and holding members 11, 14 and 15. In contrast, in the above third embodiment, a relatively large gap can be ensured between each erosion member and each of the mounting and holding members due to the provision of the engagement lips 22A and 23A. Therefore, even when the erosion members 12 and 13 are superheated and subjected to excessive thermal expansion, the horizontal stress exerted thereon may be reduced and the erosion members may be less susceptible to warpage.

Figure 11:
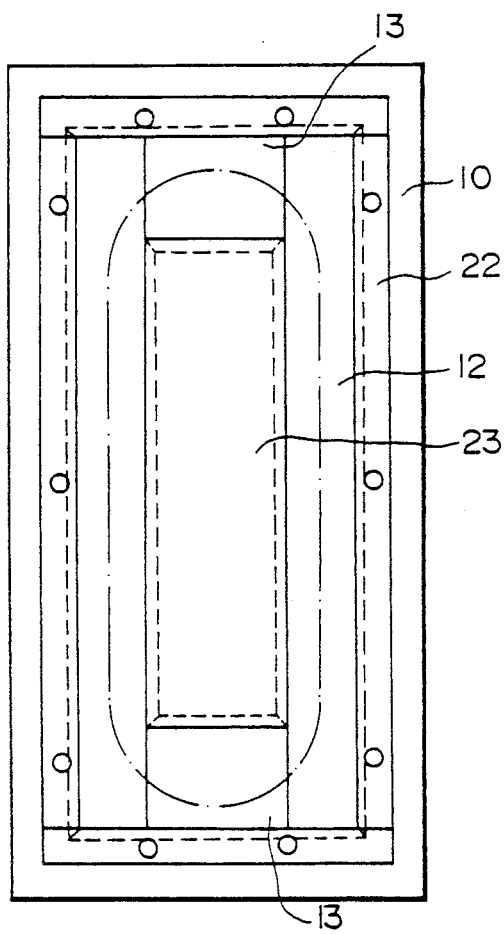
FIGS. 11 and 12 are views showing a target unit in accordance with a fourth embodiment of the invention.
Figure 12:
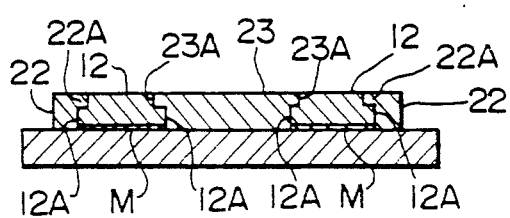

FIGS. 11 and 12 illustrate a target unit in accordance with a fourth embodiment in which the erosion members 12 and 13 are formed to have the same height as the mounting and holding members 23 and 22 and are provided with such stepped portions 12A at the inner and outer side faces thereof that the inner and outer side faces are complementary to the engagement lips 23A and 22A of the mounting and holding members 23 and 22. With this modification, the amount of the material of the mounting and holding members to be sputtered may be reduced compared to the previous embodiments since the holding and mounting members do not protrude so far over the upper faces of the erosion members 12 and 13.

Figure 13:
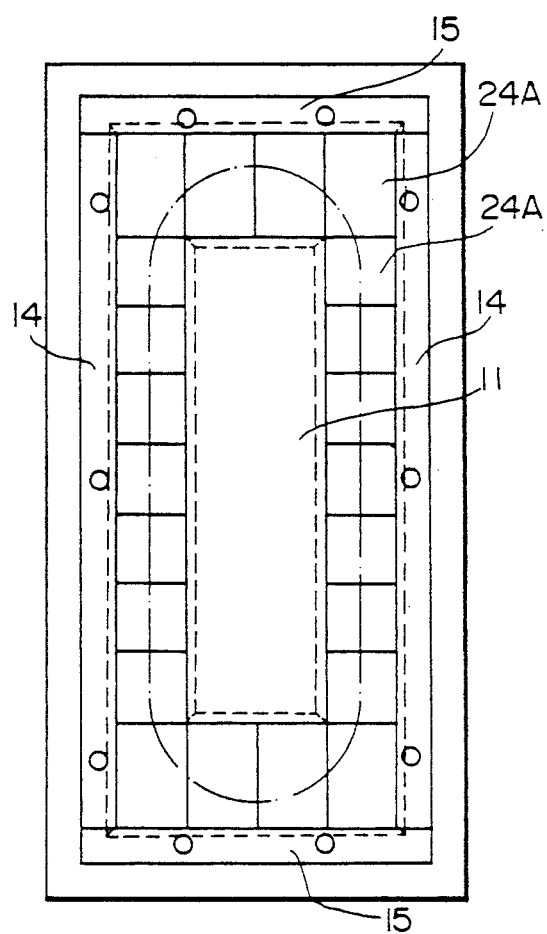
FIGS. 13 and 14 are views showing a target unit in accordance with a fifth embodiment of the invention.
Figure 14:
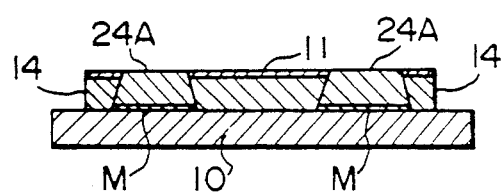

FIGS. 13 and 14 depict a fifth embodiment of the invention. In this embodiment, the target unit includes plural kinds of erosion members 24A having different compositions. With this construction, the composition of the film formed by the sputtering can be arbitrarily modified by changing the configurations, number, and compositions of the respective erosion members.

FIGS. 15 and 16 depict a sixth embodiment of the invention which differs from the first embodiment only in that a metal plate 27 having a high heat conductivity such as copper is integrally joined to the lower face of each erosion member 25, 26, and each erosion member 25, 26 is formed so that its surface portion protrudes somewhat from the surfaces of the mounting and holding members 11, 14 and 15. The metal plate 27 may be formed when preparing the erosion members 25 and 26 by compacting metal powder underneath a layer of erosion material and vacuum pressing to form an integral unit. However, a separate metal plate may be joined to the erosion member through diffusion bonding or brazing.

In the above arrangement, the rigidity of the erosion members 25 and 26 is increased due to the provision of the metal plate 27. Therefore, the erosion members 25 and 26 are less susceptible to separation from the backing plate 10 when heated, so that their overheating can be further prevented. Moreover, inasmuch as the erosion members 25 and 26 project from the mounting and holding members 11, 14 and 15, the mounting and holding members are less susceptible to sputtering.

FIG. 17 shows a target unit in accordance with a seventh embodiment of the invention. In this embodiment, flat erosion members 31 are initially warped slightly in such a manner that they are convex toward the backing plate 10, as shown by the broken line in FIG. 17. Then, the erosion members 31 are pressed against the backing plate 10 by the holding and mounting members 32 and 33 and are securely fixed thereto while being elastically deformed.

In this embodiment, the central portion of each erosion member 31 is pressed against the backing plate 10 by the elastic force. Therefore, the central portion, which is subjected to the most heating, is prevented from separating from the backing plate 10 and from becoming overheated.

In the foregoing, instead of using warped erosion members, smoothly curved convex portions 35 may be formed on the upper face of the backing plate 10 extending in the longitudinal direction of the erosion members 34, as shown in an eighth embodiment of FIG. 18.

Furthermore, as depicted in a ninth embodiment shown in FIG. 19, that surface of each erosion member 36 to be held in contact with the backing plate 10 may be formed so as to have a convex portion 36A of a V-shaped cross-section extending longitudinally thereof, and the erosion member 36 may be brought into engagement with the backing plate 10 with the peripheral end portions pressed and bent by the holding and mounting members 32 and 33. With this construction, the same advantage as those obtained for the seventh and eighth embodiments can be achieved. In addition, since the central portion of each erosion member 36, which is mainly consumed, is formed to be thick, the efficiency of usage of erosion member can be improved. In the foregoing, the convex portion 36A may be formed to have an arcuately shaped cross-section. Moreover, as depicted in a tenth embodiment shown in FIG. 20, the upper face of the backing plate 10 may be formed with recesses 37 of such a V-shaped cross-section that the inclination angle is less than that of the convex portion 36A of the erosion members 36. In the illustrated embodiment, there is further formed a groove 38 for degassing in the center of the bottom of each recess 37.

FIG. 21 depicts a further modified target unit in accordance with an eleventh embodiment. In this embodiment, each erosion member 39 is provided with a narrow groove 40 formed so as to extend longitudinally thereof. Owing to the provision of the groove 40, the thermal expansion of each erosion member 39 becomes small at its upper side and great at its lower side, and, when heated, each erosion member is caused to deform so as to be convex downwardly. Therefore, each erosion member 39 is prevented from becoming separated from the backing plate 10.

Figure 22:
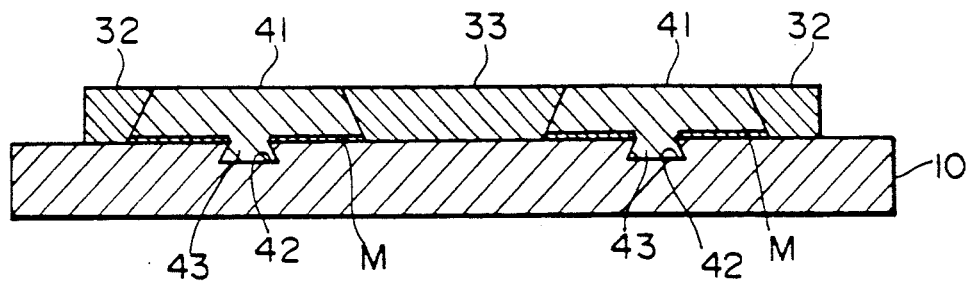

FIG. 22 a depicts target unit in accordance with a twelfth embodiment. In this embodiment, a dovetail groove 42 is formed in the backing plate 10 so as to extend along a center line of each erosion member 41, and a protrusion 43 of a shape complementary to the dovetail groove 42 is integrally formed on the lower face of each erosion member 41. Each erosion member 41 is fixed to the backing plate 10 with its protrusion 43 inserted into the dovetail groove 42. With this construction, the central portion of each erosion member 41 can not separate from the backing plate 10. In addition, when the erosion member 41 is subjected to thermal expansion, the protrusion 43 is pressed against the bottom of the dovetail groove 42, and hence the erosion member 41 is effectively cooled through the protrusion.

Figure 23:
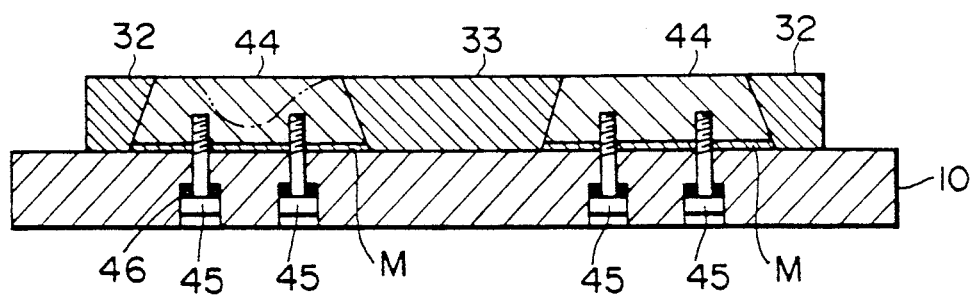

FIG. 23 illustrates a further modified target unit in accordance with a thirteenth embodiment. In the target unit, each erosion member 44 is secured to the backing plate 10 through bolts 45 which are inserted through the backing plate 10 from its rear side. As illustrated in the drawing, there is interposed a sealing member 46 such as O-ring between each bolt 45 and the backing plate 10 for the hermetical sealing. Furthermore, as illustrated, the length and position of the bolts 45 are determined lest the end of each bolt should be exposed at the surface of each erosion member 44 when the erosion member 44 is consumed.

In this embodiment, the backing plate 10 must be detached from the electrode when replacing the erosion members with new ones. However, the erosion members 44 can be more securely fixed to the backing plate 10. In addition, since the heat dissipates through the bolts 45, the cooling effect can be further increased.

Figure 24:
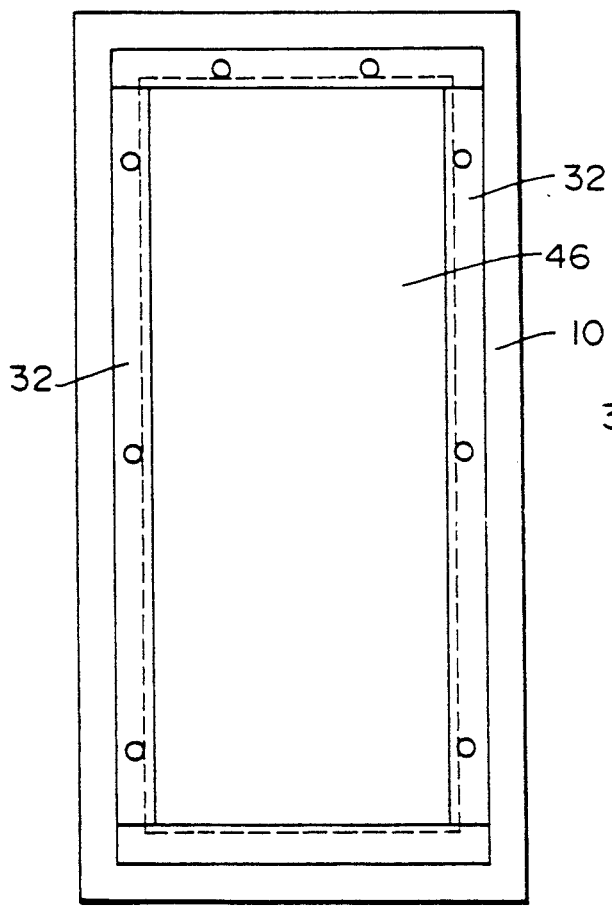
FIGS. 24 and 25 are views showing a target unit in accordance with a fourteenth embodiment of the invention.
Figure 25:
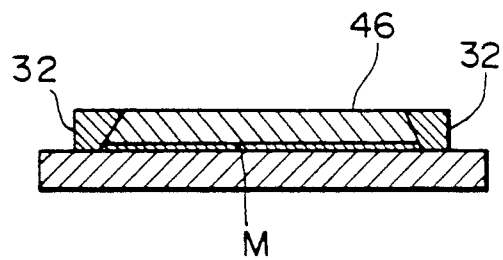
Figure 26:
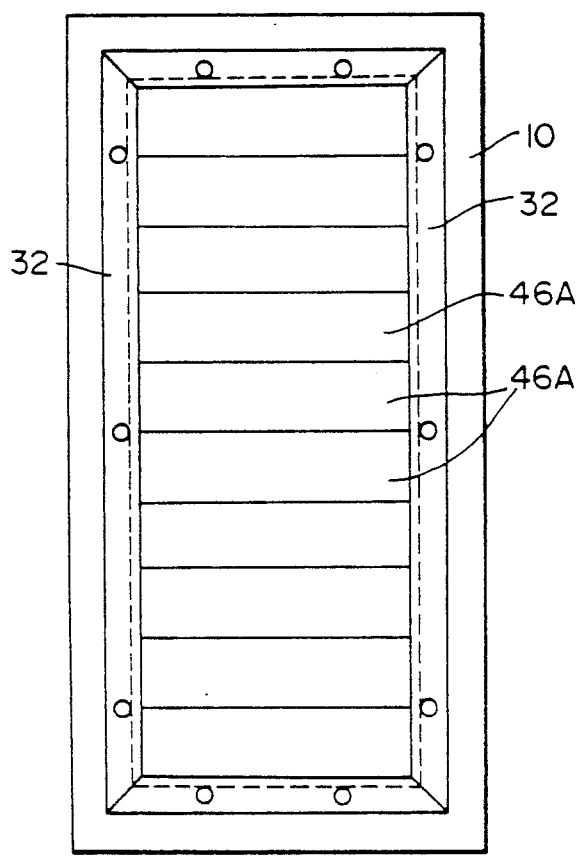
FIGS. 26 and 27 are views showing a target unit in accordance with a fifteenth embodiment of the invention.
Figure 27:
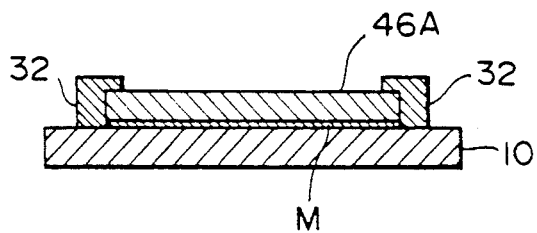

In the foregoing, the erosion members are formed around the perimeter of a rectangular shape so that they are positioned along the area on which plasma concentrates, but may be replaced with a single rectangular erosion plate 46 as shown in a fourteenth embodiment in FIGS. 24 and 25. Furthermore, as shown in a fifteenth embodiment in FIGS. 26 and 27, the single erosion plate 46 may be replaced by a plurality of erosion plates 46A of different kinds.

Figure 28:
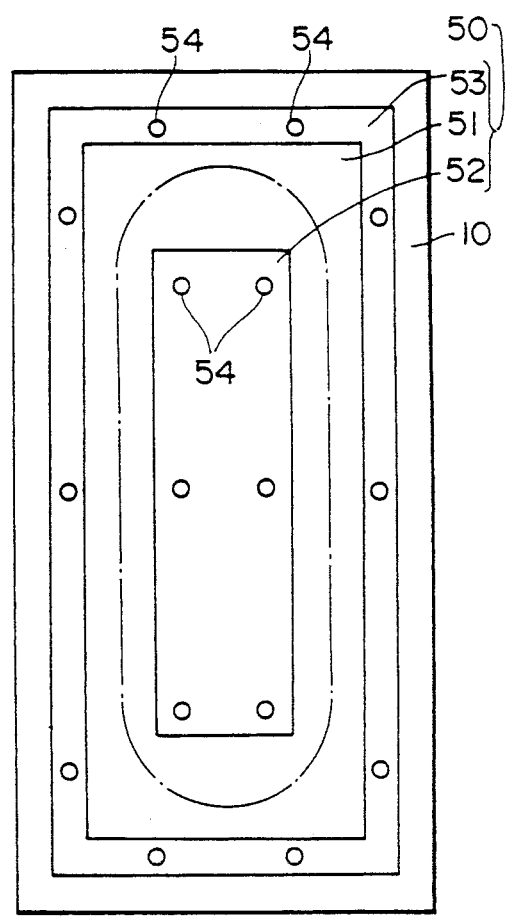
FIGS. 28 and 29 are views showing a target unit in accordance with a sixteenth embodiment of the invention.
Figure 29:
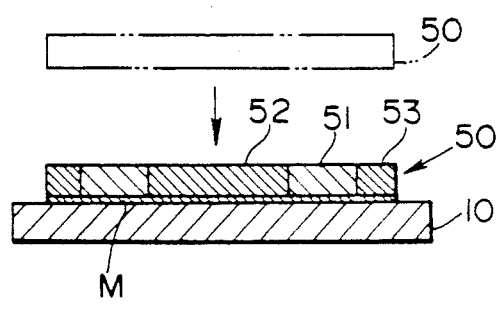

FIGS. 28 and 29 depict a further modified target unit in accordance with a sixteenth embodiment of the invention which includes a target member 50 comprised of an erosion member 51 and inner and outer holding members 52 and 53 integrally joined thereto by means of diffusion bonding, brazing or the like. The target member 50 is secured to the upper face of the backing plate 10 with the inner and outer holding members 52 and 53 being releasably secured to the backing plate 10 by a plurality of stud bolts 54. Furthermore, a thin plate M of a soft metal such as indium, tin or aluminum is interposed between the target member 50 and the backing plate 10.

Figure 30:
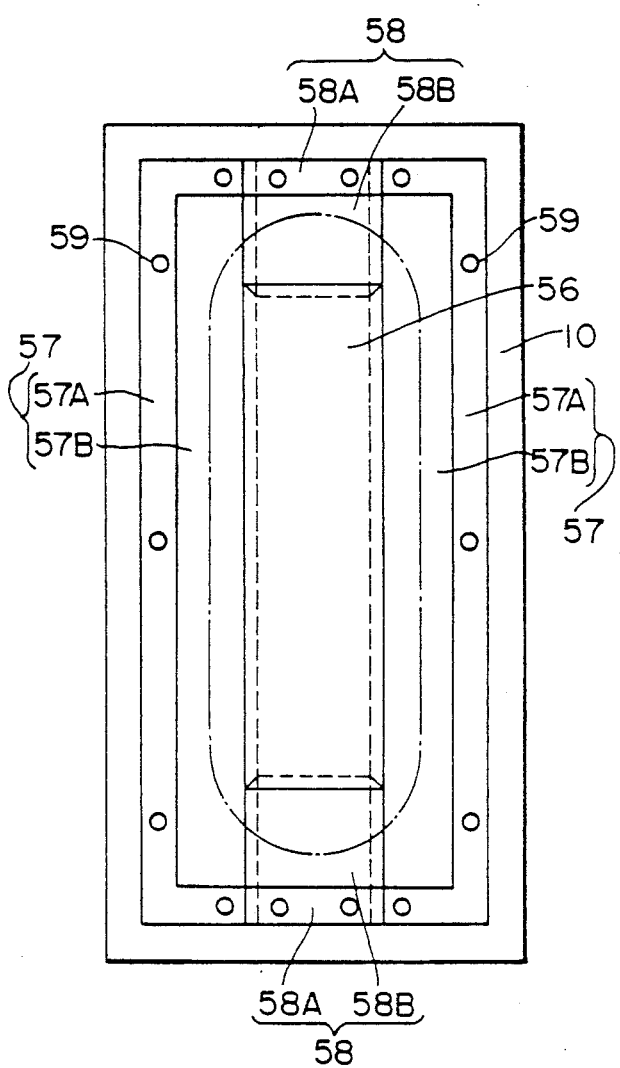
FIGS. 30 and 31 are view showing a target unit in accordance with a seventeenth embodiment of the invention.
Figure 31:
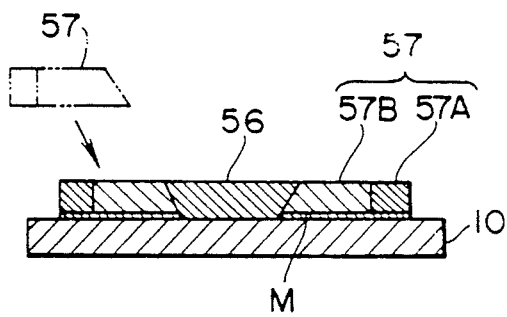

FIGS. 30 and 31 illustrate a seventeenth embodiment of the invention in which a mounting plate 56 is located at the central portion of the upper face of the backing plate 10 and securely fixed thereto, and a plurality of target members 57 and 58, each comprised of an erosion member 57B, 58B and a holding member 57A, 58A securely fixed to the erosion member, are located on the upper face of the backing plate 10 so as to surround the mounting member and are releasably secured to the backing plate 10 by stud bolts 59 each passing through the holding member 57B, 58B and threaded into the backing plate 10. In this embodiment, the thin sheet M of soft metal is interposed between each holding member and the backing plate 10. Furthermore, the peripheral side faces of the mounting plate 56 are formed to be inclined inwardly toward the backing plate 10, while the inner side faces of the target members 57 and 58 to be held in contact with these inclined faces are formed to be complementary thereto. With this construction, when the erosion members 57A and 58A are subjected to thermal expansion, they are pressed against the mounting plate 56 and the backing plate 10, so that the cooling effect is highly enhanced. Furthermore, as compared with the sixteenth embodiment, the target members 57 and 58 can be more easily replaced since the number of bolts to be removed is less.

Figure 32:
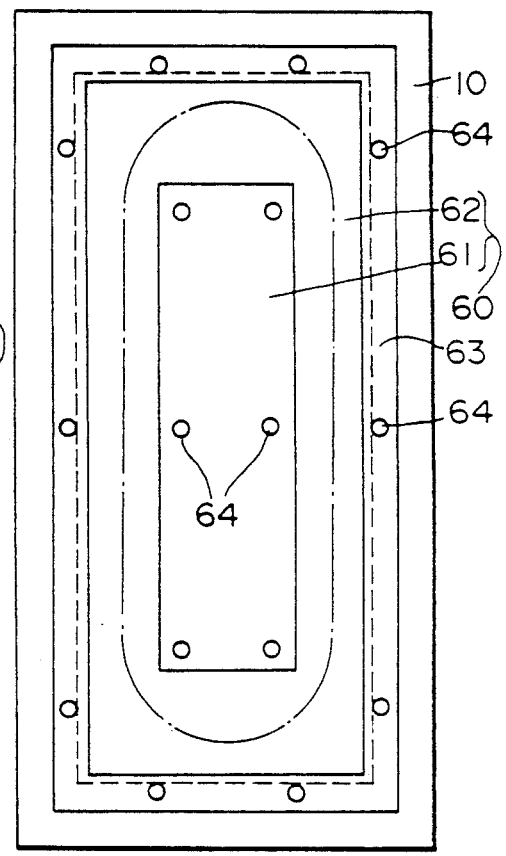
FIGS. 32 and 33 are views showing a target unit in accordance with an eighteenth embodiment of the invention.
Figure 33:
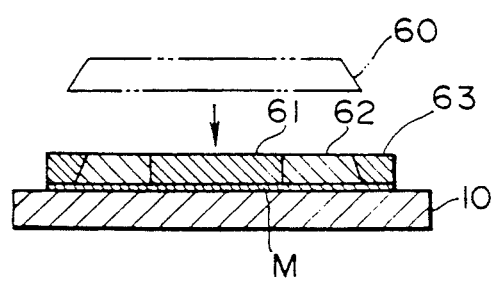

FIGS. 32 and 33 depict an eighteenth embodiment in accordance with the present invention. In this embodiment, a target member 60 is comprised of an inner holding member 61 and an erosion member 62 surrounding the inner holding member 61 and joined thereto, and is fixed to the backing plate 10 by means of an outer holding member 63. The outer side faces of the target member 60 are formed so as to be inclined outwardly toward the backing plate 10, and the inner side faces of the outer holding member 63 to be held in contact therewith are formed to be complementary thereto. Both the inner holding member 61 of the target member 60 and the outer holding member 63 are releasably secured to the backing plate 10 through bolts 64.

FIGS. 34 and 35 show a target unit in accordance with a nineteenth embodiment of the invention which includes an outer holding member 65 placed on the upper face of the backing plate 10 and having a rectangular recess 65a formed therein. The thin sheet M of soft metal is interposed between the outer holding member 65 and the backing plate 10. A target member 66, comprised of a rectangular inner holding member 66A and an erosion member 66B joined to the inner holding member 66A so as to surround it, is fitted in the recess 65A with a slight gap formed therebetween, and the target member 66 and the outer holding member 65 are releasably secured to the backing plate 10 through bolts 67.

FIGS. 36 and 37 illustrate a twentieth embodiment of the invention. In this embodiment, four target members 70 and 71 are releasably fixed to the backing plate 10. Each target member 70, 71 is comprised of a rectangular holding member 72, 73 having a rectangular recess formed therein and a rectangular erosion member 74, 75 fitted in and securely fixed to the recess of the holding member 72, 73, and is releasably secured to the backing plate 10 by bolts 76 passing through the holding members 72, 73 and threaded into the backing plate 10. In this embodiment, each erosion member 74, 75, which is susceptible to thermal deformation, is integrally joined to a respective holding member 72, 73, and hence, the erosion members are efficiently prevented from being deformed and overheated.

In the foregoing, each erosion member may be replaced by an erosion member 77 of a semi-cylindrical cross-section as depicted in a twenty-first embodiment in FIG. 38. With this construction, the efficiency of use of the erosion member can be further enhanced.

Figure 39:
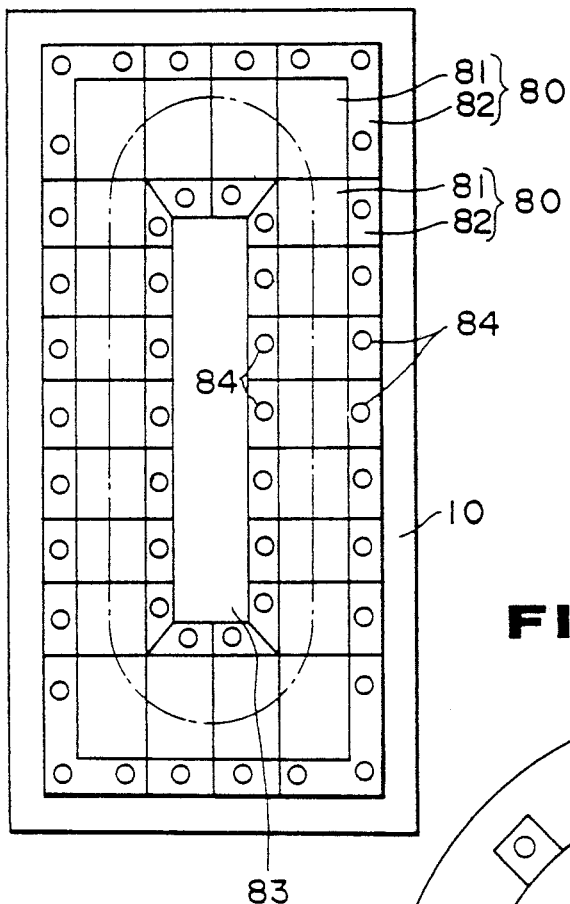
FIGS. 39 and 40 are views showing a target unit in accordance with a twenty-second embodiment of the invention.
Figure 40:
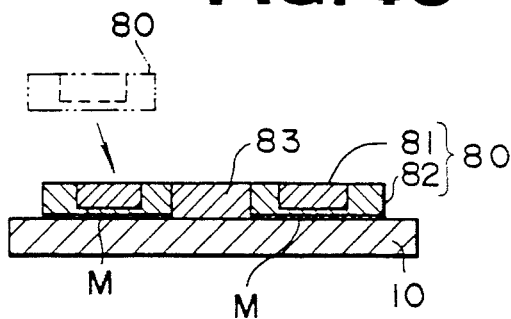
Figure 41:
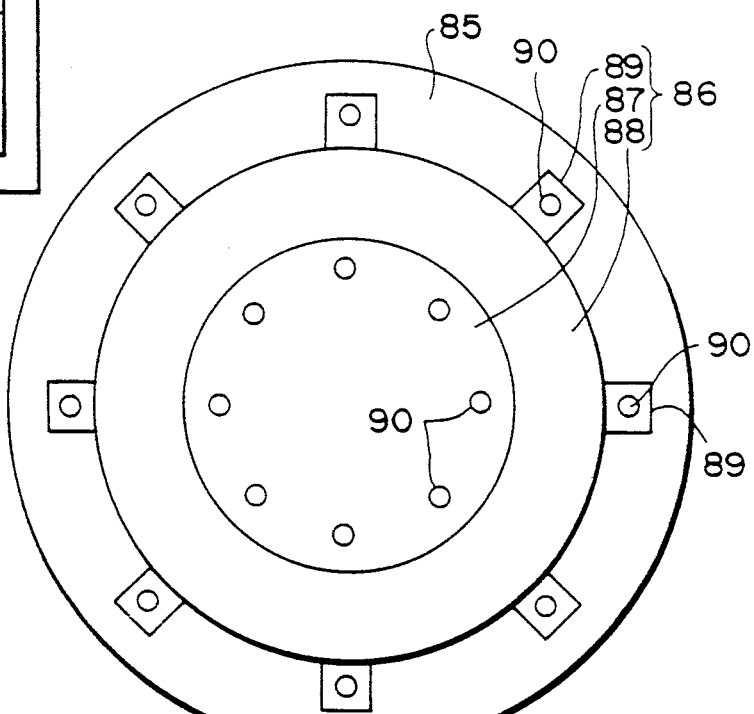
FIGS. 41 and 42 are views showing a target unit in accordance with a twenty-third embodiment of the invention.
Figure 42:
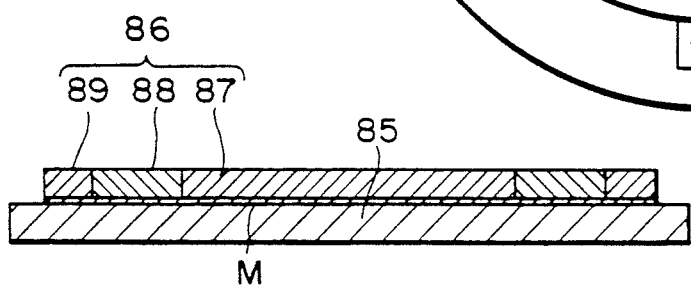

FIGS. 39 and 40 show a twenty-second embodiment in accordance with the invention in which a plurality of target members 80, comprised of erosion members 81 of different compositions and holding members 82 joined thereto, are placed so as to surround a mounting member 83 and are releasably fixed to the backing plate 10 through bolts 84. Furthermore, FIGS. 41 and 42 illustrate a twenty-third embodiment which includes a circular backing plate 85 and a circular target member 86 fixed thereto. The target member 86 is comprised of a circular inner holding plate 87, an annular erosion member 88 joined to the holding plate 87 so as to surround it, and a plurality of outer holding plates 89 arranged around the erosion member 88 in circumferentially equally spaced relation and integrally joined thereto, and is releasably fixed to the backing plate 85 by a plurality of bolts 90 passing through the inner and outer holding plates 87 and 89 and threaded into the backing plate 85.

In the foregoing, a thin sheet M of soft metal is interposed between the backing plate and at least one of the erosion member and the holding member. However, such metal sheet is not always required. Furthermore, although the above embodiments describe target units suitably used when manufacturing photomagnetic recording media by a magnetron sputtering process, the present invention may be applicable to target units of other kinds.

What is claimed is:

1. A target unit comprising:
   a backing plate; and
   a target member disposed on said backing plate, said target member including a plurality of erosion members made of a sputtering material and at least one holding member for releasably holding said erosion members on said backing plate, said plurality of erosion members being integrally joined to said holding member by brazing while said holding member is releasably secured to said backing plate.

2. A target unit as defined in claim 1, further comprising a thin piece of soft metal interposed between said backing plate and at least one of said erosion members.

3. A target unit as defined in claim 2, wherein said soft metal is selected from the group consisting of indium, tin, and aluminum.

4. A target unit as defined in claim 1, wherein said plurality of erosion members are formed and arranged so as to extend along a closed continuous line.

5. A target unit as defined in claim 1, wherein at least one of said erosion members has a side face sloping outwardly toward said backing plate while said holding member has a side face complementary to said sloping side face of said at least one of said erosion members, whereby when said holding member is pressed against said backing plate, said holding member presses said at least one of said erosion members against said backing plate.

6. A target unit as defined in claim 1, wherein said plurality of erosion members are each made of sputtering material having a different composition.

7. A target unit as defined in claim 1, wherein said backing plate has a concave surface portion on an upper face thereof, said plurality of erosion member being held in contact with said concave surface portion.

8. A target unit comprising:
   a backing plate; and
   a target member disposed on said backing plate, said target member including a plurality of erosion members made of a sputtering material and at least one holding member for releasably holding said erosion members on said backing plate, said plurality of erosion members being integrally joined to said holding member by diffusion bonding while said holding member is releasably secured to said backing plate.

9. A target unit as defined in claim 8, further comprising a thin piece of soft metal interposed between said backing plate and at least one of said erosion members.

10. A target unit as defined in claim 9, wherein said soft metal is selected from the group consisting of indium, tin, and aluminum.

11. A target unit as defined in claim 8, wherein said plurality of erosion members are formed and arranged so as to extend along a closed continuous line.

12. A target unit as defined in claim 8, wherein at least one of said erosion members has a side face sloping outwardly toward said backing plate while said holding member has a side face complementary to said sloping side face of said at least one of said erosion members, whereby when said holding member is pressed against said backing plate, said holding member presses said at least one of said erosion members against said backing plate.

13. A target unit as defined in claim 8, wherein said plurality of erosion members are each made of sputtering material having a different composition.

14. A target unit as defined in claim 8, wherein said backing plate has a concave surface portion on an upper face thereof, said plurality of erosion members being held in contact with said concave surface portion.

15. A target unit comprising:
   a backing plate; and
   a target member disposed on said backing plate, said target member including at least one erosion member made of a sputtering material and at least one holding member for releasably holding said erosion member on said backing plate;
   wherein said at least one erosion member is structurally distinct from said holding member, said erosion member having a central portion and a peripheral portion, said holding member being releasably secured to said backing plate so as to permit said at least one erosion member to be engaged to said holding member in said peripheral portion so as to be elastically distorted in such a manner that said central portion is pressed against said holding member more intensively than said peripheral portion.

16. A target unit as defined in claim 15, further comprising a thin piece of soft metal interposed between said backing plate and said at least one erosion member.

17. A target unit as defined in claim 16, wherein said soft metal is selected from the group consisting of indium, tin, and aluminum.

18. A target unit as defined in claim 15, wherein said at least one erosion member is formed and arranged so as to extend along a closed continuous line.

19. A target unit as defined in claim 15, wherein said at least one erosion member has a side face sloping outwardly toward said backing plate while said holding member has a side face complementary to said sloping side face of said erosion member, whereby when said holding member is pressed against said backing plate, said holding member presses said erosion member against said backing plate.

20. A target unit as defined in claim 15, further comprising a plurality of said erosion members, the sputtering material of each having a different composition.

21. A target unit as defined in claim 15, wherein said backing plate has a concave surface portion on an upper face thereof, said at least one erosion member being held in contact with said concave surface portion.

22. A target unit as defined in claim 15, wherein said holding member has a protruding lip formed at a side face thereof, said lip being held in engagement with said erosion member to hold said erosion member on said backing plate.

23. A target unit as defined in claim 22, wherein said erosion member has a stepped portion formed on a side face thereof and held in close engagement with said lip of said holding member, and said holding member has an upper face flush with an upper face of said erosion member.

24. A target unit as defined in claim 23, wherein said backing plate has a concave surface portion on an upper face thereof, said erosion member being held in contact with said concave surface portion.

25. A target unit as defined in claim 15, wherein said backing plate has a convex surface portion on an upper face thereof, said erosion member being held in contact with said convex surface portion.

26. A target unit as defined in claim 15, wherein said erosion member has a convex surface portion on a lower face thereof, said backing plate being held in contact with said convex surface.

* * * * *

UNITED STATES PATENT AND TRADEMARK OFFICE
CERTIFICATE OF CORRECTION

PATENT NO. : 5,066,381
DATED : November 19, 1991
INVENTOR(S) : OHTA, et al

It is certified that error appears in the above-indentified patent and that said Letters Patent is hereby corrected as shown below:

On the title page, item [75] Inventors: The name of the fifth listed inventor should read --Takayuki Shingyoji--.

Signed and Sealed this

Fifth Day of April, 1994

Attest:

BRUCE LEHMAN

Attesting Officer

Commissioner of Patents and Trademarks